US 6,570,234 B1

(12) United States Patent
Gardner

(10) Patent No.: US 6,570,234 B1
(45) Date of Patent: May 27, 2003

(54) RADIATION RESISTANT INTEGRATED CIRCUIT DESIGN

(75) Inventor: Harry Gardner, Colorado Springs, CO (US)

(73) Assignee: Aeroflex UTMC Microelectronic Systems, Inc., Colorado Springs, CO (US)

( * ) Notice: Subject to any disclaimer, the term of this patent is extended or adjusted under 35 U.S.C. 154(b) by 0 days.

(21) Appl. No.: 09/715,819

(22) Filed: Nov. 17, 2000

Related U.S. Application Data

(60) Provisional application No. 60/166,072, filed on Nov. 19, 1999.

(51) Int. Cl.[7] ............... H01L 29/76; H01L 29/94; H01L 31/062; H01L 31/113; H01L 31/119
(52) U.S. Cl. ............... 257/390; 438/128; 438/279
(58) Field of Search ............... 257/390, 213, 257/288, 297, 364, 365, 369, 372, 374, 379, 391, 394, 401, 406, 519, 547, 648, 921, 375, 314, 315, 318, 319

(56) References Cited

U.S. PATENT DOCUMENTS

| 4,799,097 A | * | 1/1989 | Szluk et al. ............... 357/42 |
| 5,168,340 A | * | 12/1992 | Nishimura ............... 257/376 |
| 5,304,831 A | * | 4/1994 | Yilmaz et al. ............... 257/341 |
| 5,668,392 A | | 9/1997 | Huang et al. |
| 6,140,687 A | | 10/2000 | Shimomura et al. |
| 6,278,287 B1 | * | 8/2001 | Baze ............... 326/9 |

FOREIGN PATENT DOCUMENTS

| DE | 39 25 123 | | 2/1991 |
| EP | 0 248 270 | | 12/1987 |
| JP | 404062975 A | * | 2/1992 |

* cited by examiner

Primary Examiner—Olik Chaudhuri
Assistant Examiner—Dana Farahani
(74) Attorney, Agent, or Firm—Morgan & Finnegan, L.L.P.

(57) ABSTRACT

Annular transistors are positioned with respect to the n-well diffusion region so that the active channels of the transistors are completely within the diffusion region, thereby avoiding the formation of the edges at the boundary between n$^+$ active channel regions and adjacent field oxide region (the bird's beak region), which are susceptible to the effect of the ionizing radiation. The edgeless design of the gate arrays reduces the degradation of the transistors caused by the bird's beak leakage, while allowing for an unmodified commercial process flow for fabrication. An outer annular transistor and one or more inner annular transistors may be provided. The outer transistor may be used as an active transistor in the formation of logic circuits, or may provide isolation for the one or more inner transistors, which may be connected to form logic circuits. The design preferably includes a provision for readily disabling the radiation resistant system so the same design can be easily transformed into a non-radiation resistant design. Other electrical components such as a resistor may be formed with another annular gate electrode to isolate the component from the deleterious effects of ionizing radiation, as well.

17 Claims, 5 Drawing Sheets

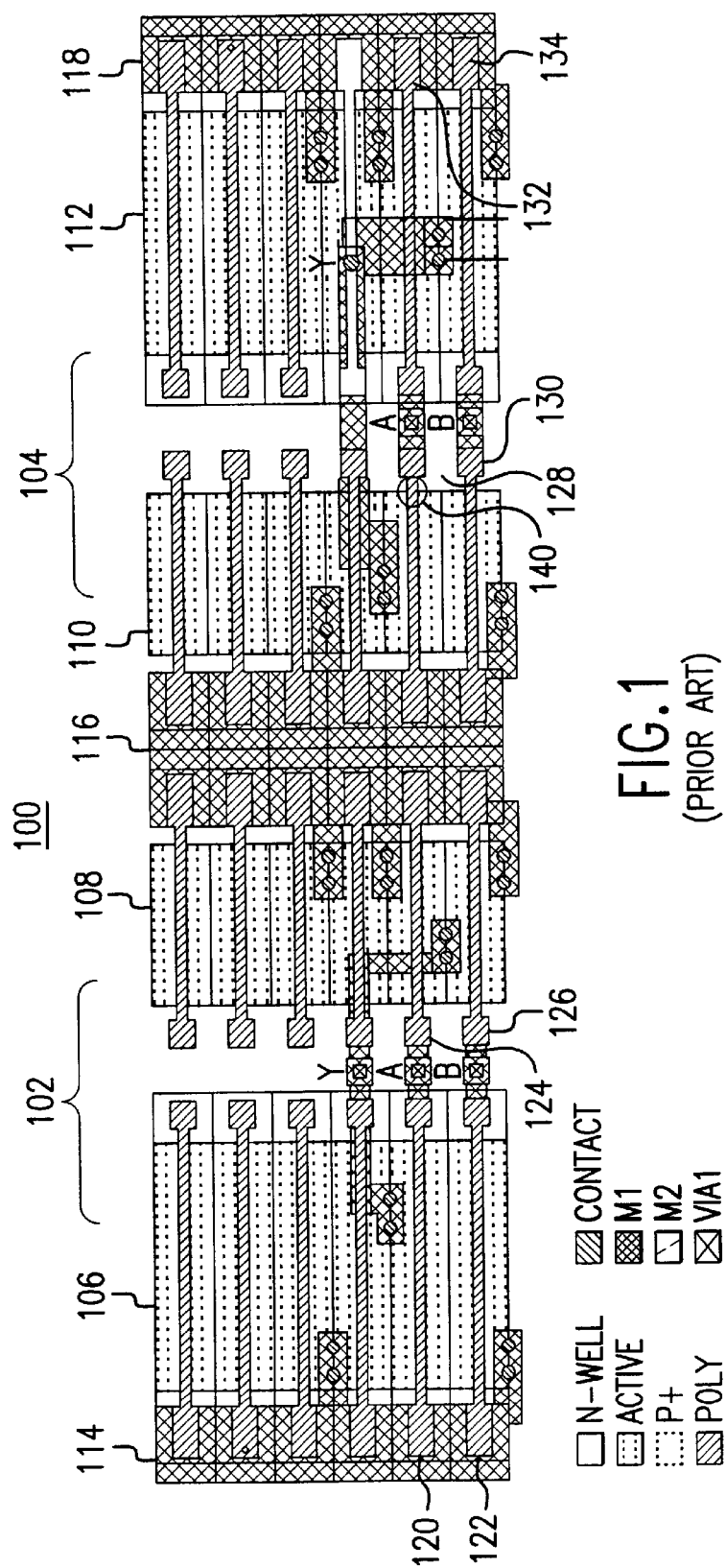
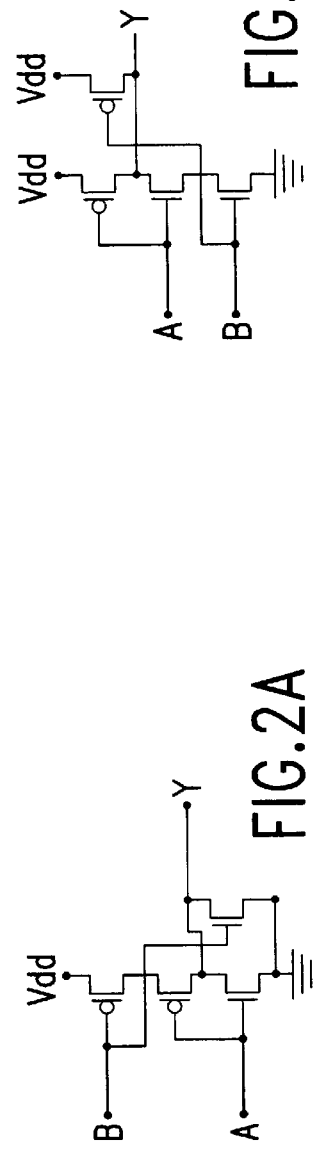
FIG. 1 (PRIOR ART)
FIG. 2A
FIG. 2B

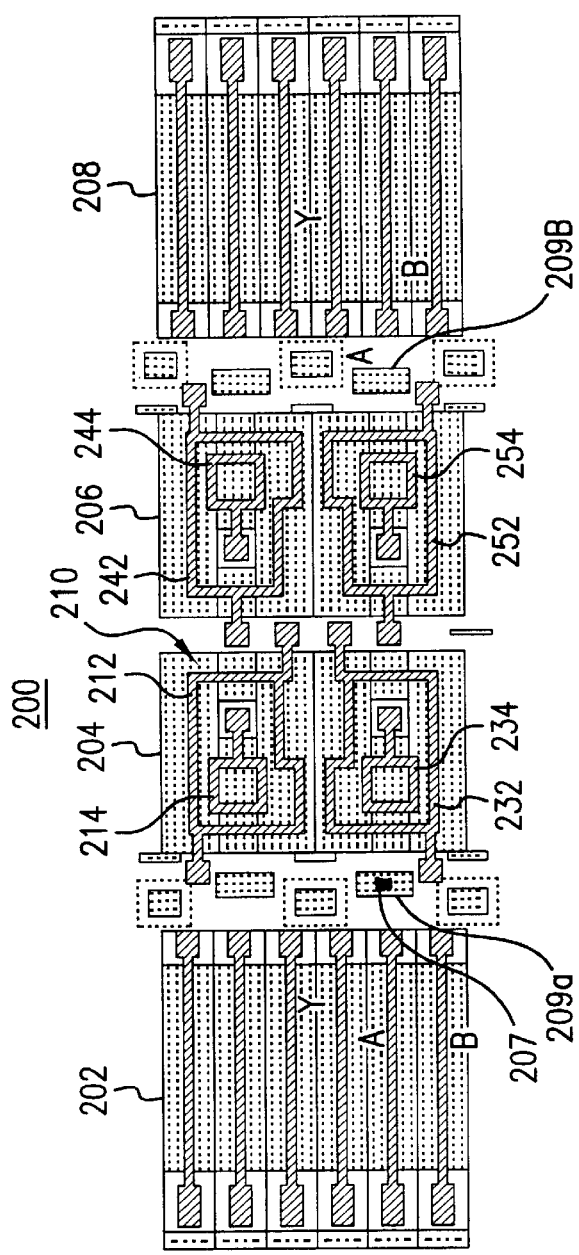

RADIATION RESISTANT INTEGRATED CIRCUIT DESIGN

The present application claims the benefit of U.S. Ser. No. 60/166,072, filed on Nov. 19, 1999, which is incorporated by reference herein.

FIELD OF THE INVENTION

The present invention relates to an integrated circuit design for radiation hardening.

BACKGROUND OF THE INVENTION

Electrons trapped in high earth orbits and electrons and protons trapped in low and medium earth orbits cause a high level of ionizing radiation in space. Such ionizing radiation causes an accumulation of charge in electronic circuits which eventually results in a malfunction or failure of the circuits.

Electron-hole pairs generated in the bulk silicon of an integrated circuit do not present a severe problem, as the electrons and holes recombine rapidly. Electron-hole pairs formed in field oxide of an integrated circuit are more difficult to deal with because the electrons are far more mobile than the holes and may become separated from the holes, interfering with recombination and resulting in an accumulation of net positive charge in the field oxide, or other dielectric film. The edge region between the diffusion region and the field oxide below a polysilicon gate, referred to as the "bird's beak" region, is particularly susceptible to the effect of the ionizing radiation. The accumulation of net positive charge in the field oxide beneath the polysilicon gate can cause leakage of electrons across the gate, turning on the gate prematurely. Even slight leakage across the many gates in a typical integrated circuit can cause excess power drain and overheating of the integrated circuit.

Integrated circuit designs have been developed to withstand high levels of ionizing radiation. Such design methodologies can involve redundancy of electronic circuits, suitable doping of the semiconductor material and spacing of electronic circuits. Such methodologies require increased cost for redesign and production.

SUMMARY OF THE INVENTION

In accordance with an aspect of this invention, the active channels of a transistor are completely within the diffusion region of the transistor, thereby minimizing the formation of active channels at edges between the diffusion region and the field oxide. Such edges, referred to as a bird's beak region, are susceptible to leakage due to ionizing radiation. Those bird's beak region that do exist, lie across regions of equipotential, minimizing the effect of such leakage. Integrated circuits in accordance with the design of the present invention may be fabricated through ordinary fabrication processes.

In one embodiment, an outer annular transistor and one or more inner annular transistors positioned within the outer annular transistor, are provided. The outer transistor may be used as an active transistor in the formation of logic circuits, or may provide isolation for the one or more inner transistors which may be connected to form logic circuits. The design preferably includes a provision for readily disabling the radiation resistant system so that the same design can be easily transformed into a non-radiation resistant design.

Other types of components used in integrated circuits can be isolated from the effects of ionizing radiation through use of an annular gate electrode, as well. For example, a resistor can be surrounded by an annular electrode to prevent deleterious leakage caused by ionizing radiation.

BRIEF DESCRIPTION OF THE DRAWINGS

FIG. 1 is a portion of a typical CMOS gate array 100 of the prior art;

FIG. 2A is a schematic diagram of a NOR gate;

FIG. 2B is a schematic diagram of a NAND gate;

FIG. 7 is a portion of a CMOS gate array 200 which incorporates the annular transistors in accordance with the present invention;

FIG. 8 is a view of a unit annular transistor 210, such as the annular transistors shown in the upper side or the n-channel region 204 of FIG. 7;

DETAILED DESCRIPTION OF THE INVENTION

Figure 3:
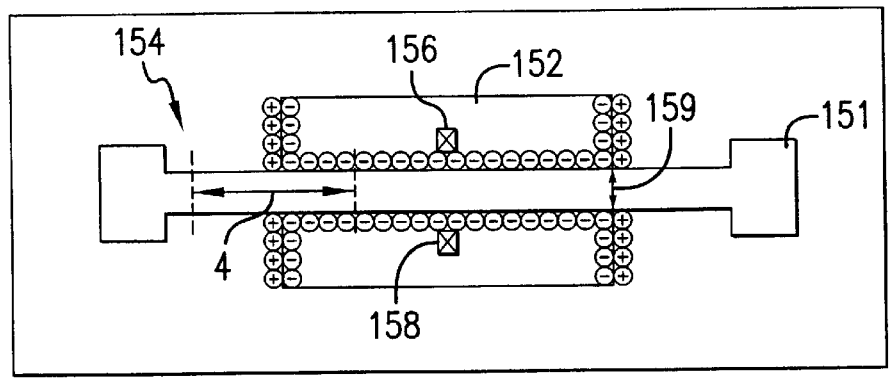
FIG. 3 illustrates a unit transistor 150 of the CMOS gate array 100.

FIG. 1 is a portion of a typical CMOS gate array 100. The gate array 100 is personalized to form a NOR gate 102 on its left side and a NAND gate 104 on its right side. The NOR gate 102 and NAND gate 104 have p-channel transistor regions 106, 112 and n-channel transistor regions 108, 110, respectively. FIGS. 2A and 2B are schematic diagrams of the NOR gate 102 and NAND gate 104, respectively, as shown in FIG. 1.

FIG. 3 illustrates the effect of ionizing radiation on one exemplary unit transistor 150 of the CMOS gate array 100. The unit transistor 150 comprises a gate electrode 151, an active region 152 and a field oxide region 154. Contacts 156, 158 are located in the active region 152.

If ionizing radiation impacts the CMOS gate array 100, electron-hole pairs are generated in the field oxide region 154. While the gate electrode 151 is in a high voltage state, fast moving electrons from the electron-hole pairs migrate to the gate electrode 151. Holes, indicated by the positive bubbles in FIG. 3, remain in the field oxide 154 region. As a result of repeated exposure to radiation, holes accumulate inside of the field oxide region 154. The accumulated holes in the field oxide region 154 attract electrons in the active region 152, as indicated by the negative bubbles. The accumulated electrons cause conductivity inversion of the active region 152, creating a conductive channel or leakage path along the edge 159, underneath the gate electrode 151, shorting out the transistor 150.

Figure 4:
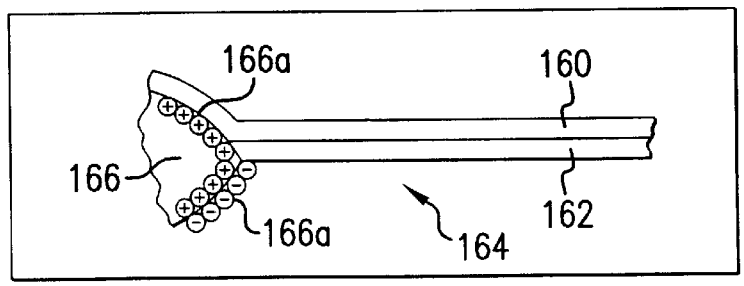
FIG. 4 shows a magnified, cross-sectional view of the unit transistor 150 which was cut along the line indicated as an arrow 4 in FIG. 3.

FIG. 4 shows a magnified, cross-sectional view of the unit transistor 150 along arrow 4 in FIG. 3. The cross-sectional view shows the gate electrode 160 and a gate insulator 162 formed on a silicon substrate 164. The cross-sectional view shows a "bird's beak" along the edge 166*a* of the field oxide region 166. Positive and negative signs in the field oxide region 166 and silicon substrate 164, respectively, show the accumulation of holes and attracted electrons in the regions.

Figure 5:
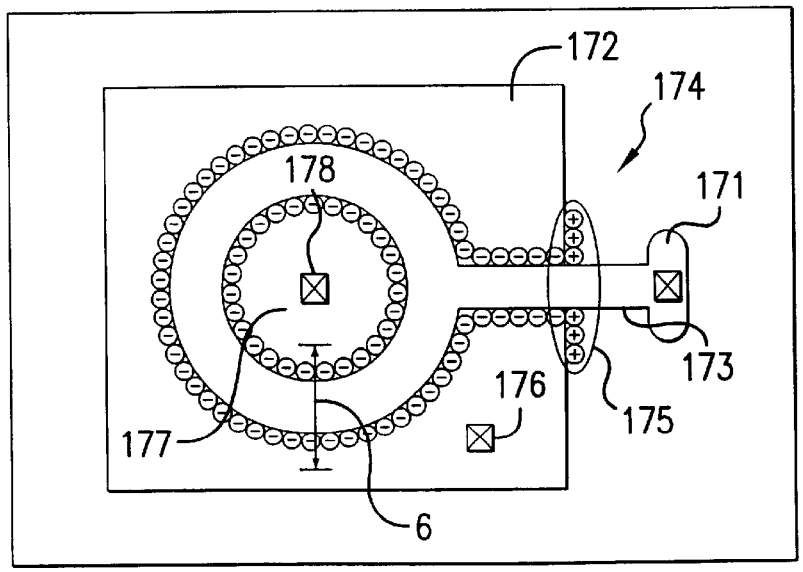
FIG. 5 illustrates an annular transistor 170 designed in accordance with the present invention.

FIG. 5 is a schematic representation of an annular transistor 170 in accordance with the present invention, which avoids the leakage problems discussed above. The annular transistor comprises a gate electrode 171, an active region 172, a field oxide region 174 and contacts 176, 178 formed on the active region 172. The region 172 is a source and the region 177 is a drain in this embodiment. The active region 172 is connected to ground through the contact 176. The source and drain region may be reversed depending on the logic connection of the circuit tobe formed with that transistor, as is known in the art.

Figure 6:
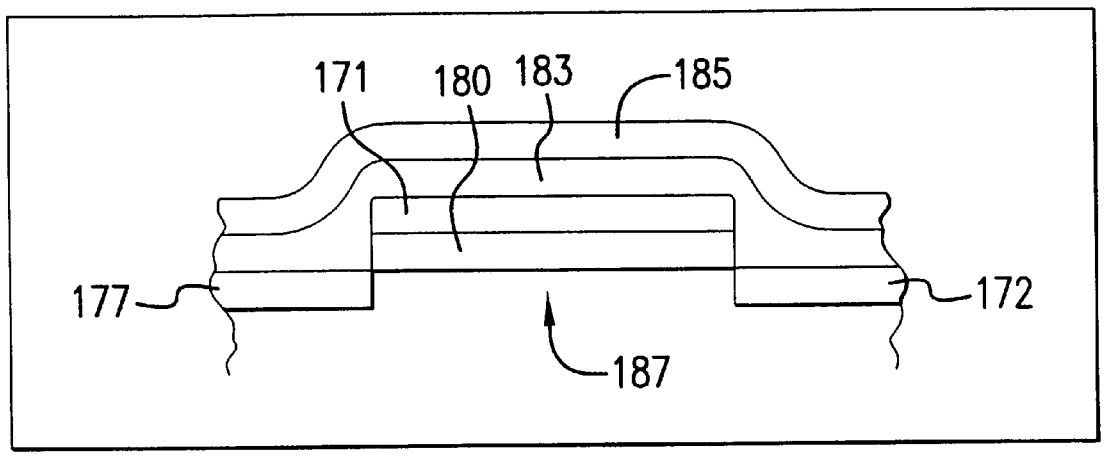
FIG. 6 is a cross sectional view of the transistor 170 which was cut along the line indicated as an arrow 6 in FIG. 5.

FIG. 6 is a cross sectional view of the annular transistor 170 along arrow 6 of FIG. 5. Underneath the gate electrode 171 is a thin gate insulating layer 181 formed on a substrate 187. Above the gate electrode 171 is a thick insulating layer of an oxide 183 such as silicon oxide, providing insulation between the gate electrode 171 and over laying metallization layer 185, which provides logic connections between the transistors.

While the transistor 170 is exposed to a radiation and the gate electrode 171 is in high voltage state, electrons in the diffusion region 172 may be attracted around the edge of the gate electrode 171, due to the accumulated holes in the oxide layers (not shown) on top of the gate electrode 171. However, the attracted electrons do not form a deleterious leakage channel across the gate electrode 171 because of the thin gate insulator underneath the gate electrode 171. As a result, leakage current between the source 177 and drain region 172 is reduced.

The gate electrode 171 includes an arm region 173. A leakage channel may or may not be created along the boundary 175 between the active region 172 and field oxide region 174, as described above with respect to FIGS. 3 and 4. Since both sides of the leakage channel are located in the active region 172, which is connected to ground, both sides are in an equipotential region. Leakage across this possible leakage channel would not, thereby, have a deleterious effect.

FIG. 7 is a portion of a CMOS gate array 200 which incorporates the annular transistors of the present invention, to provide resistance to the effect of the ionizing radiation. The gate array 200 comprises p-channel regions 202, 208 and n-channel regions 204, 206. Outer annular type n-channel transistors 212, 232, 242, 252 and inner annular type n-channel transistors 214, 234, 244, 254 are provided in the n-channel regions 204, 206, respectively, which are functionally equivalent to the n-channel transistors shown in the gate array 200 of FIG. 1. The outer and inner annular transistors form a basic framework for logic circuits.

FIG. 8 is a view of a unit annular transistor 210, such as the annular transistors shown in the upper side of the n-channel region 204 of FIG. 7. The annular transistor 210 comprises an outer transistor 212 and an inner transistor 214. The inner transistor 214 has an isolated field oxide region 216 for contact to the inner transistor 214. The diffusion region 218 acts as a source for the outer transistor 214. The diffusion region 220 may act either as a source or a drain, or both, for the outer transistor 212 and the inner transistor 214, depending on the logic circuit to be defined by the transistors, as discussed further below. Similarly, the diffusion region 222 acts either as a source or a drain for the inner transistor 214, depending on the logic circuit to be defined.

The annular portion of the gate electrodes, which form the active channels of the annular transistors 212, 214, are located completely within the diffusion region 217. The arms 213, 215, are provided in contact with the field oxide regions 211, 216. The field oxide regions are provided to connect the annular transistors to other transistors. The arms 213, 215, which have boundaries between the diffusion regions and the field oxide regions, are susceptible to the effect of the ionizing radiation and may or may not form a leakage channel. As discussed above, however, both sides of such a leakage channel are located in an equipotential region. The diffusion region 218 is connected to ground in the personalization process. Any leakage that does occur at the edge 224 is therefore absorbed by ground and does not have a deleterious effect on the outer transistor 212. While leakage may occur at the edge 224 which is at the boundary between the diffusion regions 218 and the field oxide regions 211, such leakage is shunted in the diffusion regions 218. It is apparent from FIG. 8 that any leakage at the edge 226 would be across equipotential regions of the diffusion region 220. Therefore, in both cases, the leakage does not have a deleterious effect on the operation of the annular transistors 212, 214.

The gate electrode of the outer transistor 212 may be also connected to ground. With the transistor 212 tied to ground, electrons are repelled from the gate electrode during exposure to radiation. The outer transistor 212 thereby isolates the inner transistor 214 from the effects of the radiation. Although this embodiment is described with a polysilicon annular transistor device for isolation, other types of transistors, such as metal gate or metal field device, may also be used for isolation. The fabrication process of the metal gate or metal field device is well known in the art.

Figure 9:
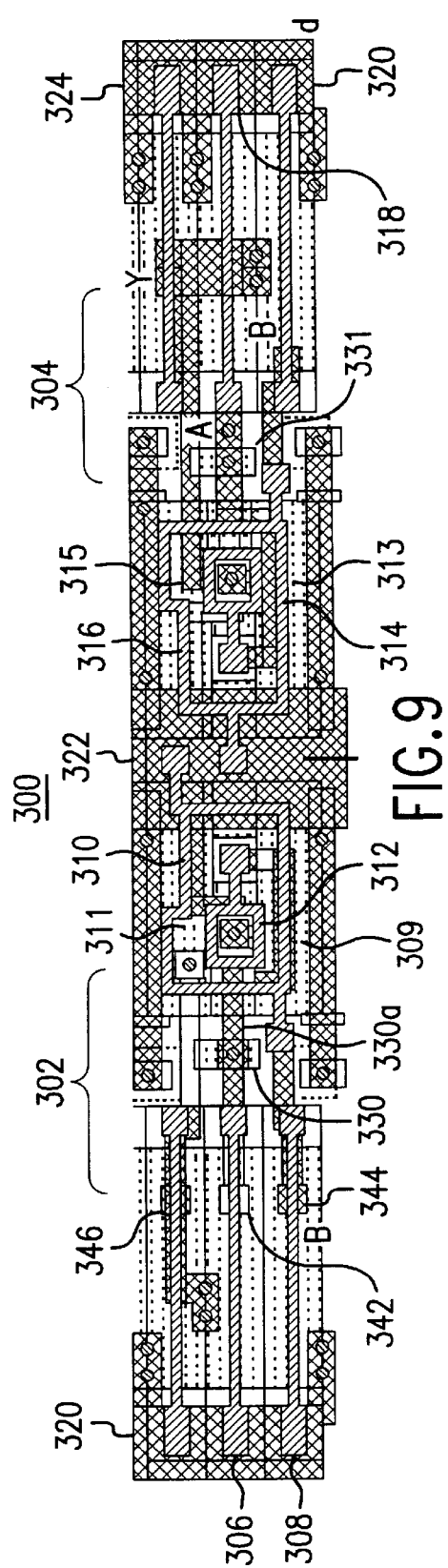
FIG. 9 is a portion of a CMOS gate array 300 with personalized metal layer.

Referring again to FIG. 7, diffusion regions 209*a*, 209*b* are provided between n-type and p-type diffusion regions for optionally disabling the radiation tolerant system. The diffusion regions 209*a*, 209*b* may be connected to a more positive voltage by an over laying metal or polysilicon strip, through a contact 207 during a personalization process, as shown in FIG. 9, for example. (See 330*a* in FIG. 9). If the CMOS gate array 200 is exposed to radiation while the over laying strip is in high voltage state, positive charges are generated and accumulated in the field oxide region under the strip. As a result, electrons may be attracted to and accumulate in the silicon substrate under the field oxide region. A leakage channel may thereby be formed between the two diffusion regions 204, 209*a*. As a result, if the over laying strip connects the gate electrode of the inner annular transistor 234 to power, the gate electrode of the transistor 234 may be connected to the diffusion region 209*a* which can leak to ground 204, thereby disabling the radiation hardening feature of the gate array 200. Alternatively, the gate electrode of the inner annular transistor 234 may be connected to a drain (not shown) of a regular n-channel transistor for the same disabling effect. In other words, a radiation tolerant integrated circuit can be readily converted to a non-radiation tolerant circuit.

In FIG. 9, personalized metal layers are provided on the gate array 200 form a NOR gate 302 on the left side and NAND gate 304 on the right side of the gate array. The NOR gate 302 includes two serially connected p-channel transistors 306, 308 connected to two annular n-channel transistors 310, 312. The annular n-channel transistors 310, 312 are connected in parallel, as in the schematic diagram of FIG. 2A. The source region 309 is connected to ground 322, providing ground for the annular transistor 310. The center region of the annular transistor 312 is similarly connected.

Since the two n-channel transistors 310, 312 are connected in parallel, the diffusion region 311 between them acts as a drain for both transistors.

The NAND gate 304 includes two parallel connected p-channel transistors 318, 320 connected to two serial annular n-channel transistors 314, 316. The annular n-channel transistors 314, 316 are connected in series, as in the schematic diagram of FIG. 2B. The source region 313 is connected to the ground 322, grounding the annular transistor 316. Since the two n-channel transistors 314, 316 are connected in series, the diffusion region 315 between them acts as a drain for the transistor 314 and a source for the transistor 316. Such a configuration is referred to as "stacked" annular transistors.

In both the NOR gate 302 and the NAND gate 304, the diffusion regions 309, 313 outside of the outer n-channel transistors 310, 316 are connected to the ground 322, thereby shielding each of the logic gates 302, 304 from neighboring logic gates. Any leakage occurring at the edges of the arm portions of the transistors 310, 316 is, therefore at equipotential (i.e. ground).

The gate array 300 can be viewed as functionally equivalent to the gate array 100 of FIG. 1, except that the regular n-channel transistors of gate array 100 are replaced with the n-channel annular transistors in the gate array 300. Although n-channel annular transistors are used to describe the radiation hardening features, other types of transistors, such as p-channel annular transistors, may also be used to implement the radiation hardening features.

As discussed above in FIG. 9, the diffusion regions 330, 331 are connected to over laying metal strips through contacts, forming field devices susceptible to ionizing radiation, as described above. The radiation tolerant nature of the logic circuits 302, 304 is therefore disabled in the gate array 300 in FIG. 9.

Figure 10:
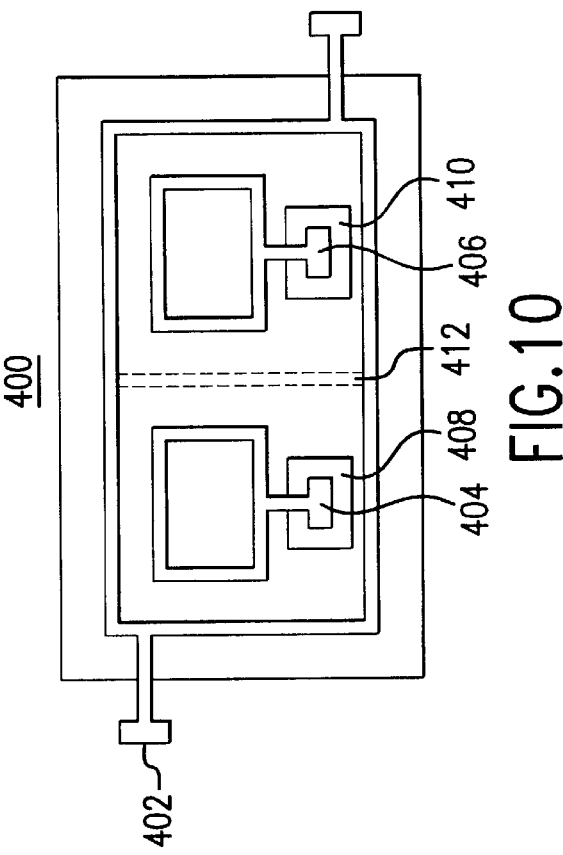
FIG. 10 is a view of a unit annular transistor 400 of another embodiment of the present invention.

FIG. 10 is a view of a unit annular transistor 400 of another embodiment of the present invention. The annular transistor unit 400 comprises one outer transistor 402 and two inner transistors 404, 406. Each of the two inner transistors 404, 406 has field oxide regions 408, 410, respectively, for contact to the inner transistors 404, 406. Each of the three transistors 402, 404, 406 may be used as an active transistor. Alternatively, the gate electrode of the outer transistor 402 may be connected to ground to isolate the two inner transistors 404, 406. Or, the two inner transistors 404, 406 may be separated by extending the gate electrode of the outer transistor 402, as indicated by dotted lines 412. The two transistors 404, 406 may then be used independently to form a logic circuits. Additional inner transistors may also be provided, depending on the complexity of the desired logic circuits.

Figure 11:
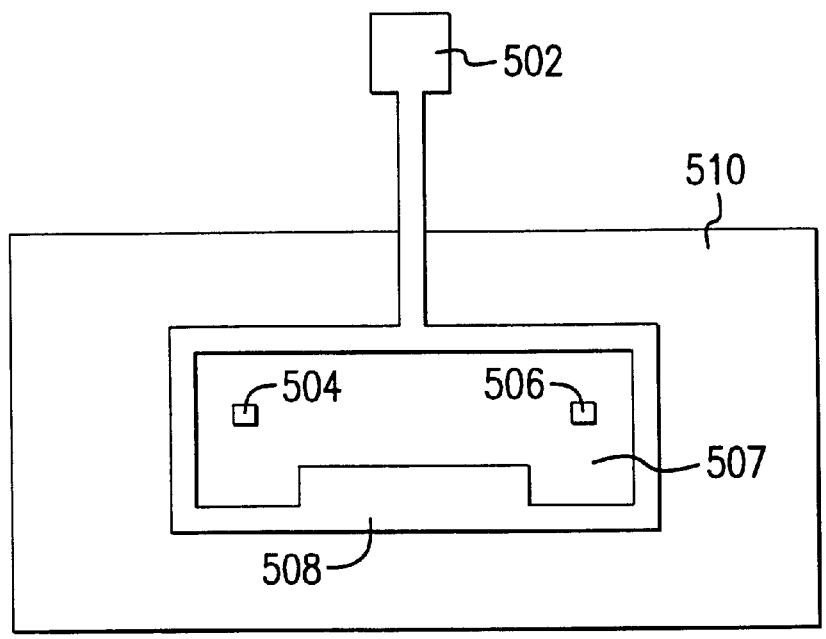
FIG. 11 is a view of a resistor 500 designed according to the annular concept of the present invention.

Other types of electrical components can be isolated from the effects of ionizing radiation through the use of an annular configuration. FIG. 11 illustrates how the annular transistor concept is adapted to isolate a typical resistor 500 from the effects of ionizing radiation. The resistor 500 in accordance with the present invention comprises a polysilicon ring 502 formed on a diffusion region 510. Both thepolysilicon ring 502 and diffusion region 510 are connected to ground to isolate the interior diffusion region 507. The grounded polysilicon ring 502 isolates the inside diffusion region of the ring. The resistor 500 is defined by the placement of contacts 504, 506 on the interior diffusion region 507. The resistance of the resistor 500 may be adjusted by adjusting the width of a portion 508 of the polysilicon ring 502, thereby adjusting the area of the diffusion region inside the annular polysilicon gate strip.

The annular transistor design of the present invention enables the use of drain regions with a smaller area than in a conventional gate array design with parallel gate electrodes. Therefore, the likelihood of a single event upset is also reduced.

The annular transistors of the present invention may be produced by conventional fabrication processes.

Although the annular transistors are used only in the n-channel regions in the embodiment described above, the annular transistors may also be used in the p-channel transistor regions or both n and p-channel transistor regions.

While the invention has been described with respect a gate array, it is apparent to one of ordinary skill in the art that the invention is applicable to other types of integrated circuits such as standard cell design and full custom layout design.

Although illustrative embodiments of the present invention, and various modifications thereof, have been described in detail herein with reference to the accompanying drawings, it is to be understood that the invention is not limited to these embodiments and the described modifications, and that various changes and further modifications may be effected therein by one skilled in the art without departing from the scope or spirit of the invention, which is defined in the claims, below.

What is claimed is:

1. A radiation hardened integrated circuit device on a semiconductor substrate, comprising:

an outer annular transistor having an outer annular gate electrode disposed on a first diffusion region of said semiconductor substrate, a second diffusion region being bounded by said outer annular gate electrode, a portion of said outer annular gate electrode forming an active channel of said outer annular transistor and being located completely within said first diffusion region; and at least one inner annular transistor having an inner annular gate electrode disposed on said second diffusion region, said at least one inner annular transistor being surrounded by said outer annular transistor and connected to a field oxide region completely isolated within said outer annular transistor.

2. The radiation hardened device of claim 1, further comprising an additional inner annular transistor disposed on said second diffusion region.

3. The radiation hardened device of claim 2, wherein said outer gate electrode is connected to ground, thereby isolating said at least one inner annular transistor and said additional inner annular transistor from other neighboring transistors.

4. The radiation hardened device of claim 2, wherein said at least one inner annular transistor and said additional inner annular transistor are separated from one another by a portion of said outer gate electrode extended there between.

5. The radiation hardened device of claim 2, wherein said outer annular transistor is one of a metal or polysilicon field or a metal or polysilicon gate MOS transistor.

6. The radiation hardened device of claim 1, wherein said outer annular transistor and said at least one inner annular transistor are connected to other neighboring transistors to form a logic circuit.

7. The radiation hardened device of claim 1, wherein the integrated circuit is a CMOS.

8. The radiation hardened device of claim 1, wherein the integrated circuit is a metal gate device.

9. The radiation hardened device of claim 8, wherein the metal gate device uses a grounded metal field for isolation.

10. An annular transistor, comprising:

an outer annular region of a first conductivity type on a semiconductor substrate and surrounded by a field insulator region, said outer annular region including a first contact of an integrated circuit device and having an inner edge surrounding a central area of said substrate;

an inner region of said first conductivity type on said semiconductor substrate, said inner region occupying a portion of said central area including a second contact of said integrated circuit device and separated from said outer annular region by a ring area on said substrate;

a thin insulator layer formed on the surface of said substrate in said ring area; and a conductive layer formed on said thin insulator layer as a gate electrode of said integrated circuit device.

11. The annular transistor of claim 10, wherein a resistor is defined by positioning at least two contacts within said inner region.

12. The resistor of claim 11, wherein the resistance of the resistor is adjusted by adjusting the width of at least a portion of said outer annular region.

13. A semiconductor device, comprising:

an outer annular region of a first conductivity type on a semiconductor substrate and surrounded by a field insulator region, said outer annular region connected to a reference potential and having an inner edge surrounding a central area of said substrate;

an inner region of said first conductivity type on said semiconductor substrate, said inner region occupying a portion of said central area and separated from said outer annular region by a ring area on said substrate;

a ring insulator layer formed on the surface of said substrate in said ring area;

a conductive layer formed on said ring insulator layer and connected to said reference potential; and said inner region having first and second electrodes forming a semiconductor component.

14. The semiconductor device of claim 13, wherein said electrical component is a resistor.

15. The semiconductor device of claim 14, wherein said resistance of the resistor is adjusted by adjusting the area of a diffusion region within outer annular region.

16. The semiconductor device of claim 13, wherein said outer annular region is in a ground state.

17. A radiation hardened integrated circuit device on a semiconductor substrate, comprising:

an outer annular region of a first conductivity type on a semiconductor substrate and surrounded by a field insulator region, said outer annular region forming a first electrode of a first integrated circuit device and having an inner edge surrounding a central area of said substrate;

an inner annular region of said first conductivity type on said semiconductor substrate, forming a second electrode of said first integrated circuit device and a first electrode of a second integrated circuit device, said inner annular region occupying a first portion of said central area and separated from said outer annular region by a first ring area on said substrate, said inner annular region having an inner edge surrounding a second portion of said central area of said substrate;

a first thin insulator layer formed on the surface of said substrate in said first ring area;

a first conductive layer formed on said first thin insulator layer as a gate electrode of said first integrated circuit device;

an inner central region of said first conductivity type on said semiconductor substrate, said inner central region occupying part of said second portion of said central area forming a second electrode of said second integrated circuit device and separated from said inner annular region by a second ring area on said substrate;

a second thin insulator layer formed on the surface of said substrate in said second ring area; and a second conductive layer formed on said second thin insulator layer as a gate electrode of said second integrated circuit device.

\* \* \* \* \*